United States Patent
Ichino

(10) Patent No.: US 7,214,924 B2
(45) Date of Patent: May 8, 2007

(54) LIGHT-RECEIVING METHOD OF AN AVALANCHE PHOTODIODE AND A BIAS CONTROL CIRCUIT OF THE SAME

(75) Inventor: Moriyasu Ichino, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/488,077

(22) Filed: Jul. 18, 2006

(65) Prior Publication Data

US 2006/0255245 A1    Nov. 16, 2006

Related U.S. Application Data

(62) Division of application No. 10/943,211, filed on Sep. 17, 2004.

(30) Foreign Application Priority Data

Sep. 19, 2003    (JP) .............................. 2003-327015

(51) Int. Cl.
*H01J 40/14*    (2006.01)
(52) U.S. Cl. .......................... 250/214 R; 250/214 AG; 250/214 VT; 327/514
(58) Field of Classification Search ............ 250/214 R, 250/214 A, 214 LA, 214 AG, 214.1, 214 VT; 327/514
See application file for complete search history.

(56) References Cited

U.S. PATENT DOCUMENTS

| 4,949,144 | A | | 8/1990 | Kuroda et al. |
| 5,548,112 | A | * | 8/1996 | Nakase et al. .......... 250/214 C |
| 6,794,631 | B2 | | 9/2004 | Clark |

FOREIGN PATENT DOCUMENTS

| JP | 63-77171 | 4/1988 |
| JP | 63-105541 | 5/1988 |
| JP | 9-321710 | 12/1997 |
| JP | 2000-244418 | 9/2000 |

OTHER PUBLICATIONS

Notice of Reasons for Rejection from Japanese Patent Office with English translation, Jan. 2007.

* cited by examiner

*Primary Examiner*—Kevin Pyo
(74) *Attorney, Agent, or Firm*—Smith, Gambrell & Russell, LLP

(57) ABSTRACT

The present invention provides a method to maintain a multiplication factor of an avalanche photodiode independent on temperatures without additional devices. The light-receiving apparatus of the invention includes an avalanche photodiode (APD), a dividing circuit, and a bias supplying circuit. The APD has a first region, where a significant multiplication factor appears, and a second region without any multiplication factor. The dividing circuit extracts a second signal.

4 Claims, 7 Drawing Sheets

LIGHT-RECEIVING METHOD OF AN AVALANCHE PHOTODIODE AND A BIAS CONTROL CIRCUIT OF THE SAME

CROSS REFERENCE TO RELATED APPLICATION

This application is a division of Ser. No. 10/943,211, filed Sep. 17, 2004 and which is being incorporated in its entirety herein by reference.

BACKGROUND OF THE INVENTION

1. Field of the Invention

The present invention relates to a light-receiving method of an avalanche photodiode (APD) and a bias control circuit for the APD.

2. Related Prior Art

The APD, which uses a physical phenomenon of the avalanche breakdown of the semiconductor p-n junction at a high reverse bias voltage, has a multiplication factor greater than unity. The multiplication factor means that how many electrical carriers can be generated by a signal photon. Therefore, the APD can generate a large photo current from a weak optical signal. The design or the specification of the circuit connected to the APD strongly depends on how large the multiplication factor thereof is set. The PIN-PD, which is a semiconductor light-receiving device similar to the APD, generally has a multiplication factor smaller than unity because the PIN-PD shows no avalanche breakdown phenomenon.

When a large multiplication factor is set by applying the high reverse bias voltage to the APD, a noise involved in the photo current output from the APD will also increase. On the contrary, a small multiplication factor leads the optical sensitivity of the APD insufficient to a presetting specification. The Japanese patent application published as H09-321710 has disclosed that the bias voltage to the APD is controlled to maximize the signal-to-noise ratio (SNR) thereof. The method uses two filters, one of which extracts the signal component and the other extracts the noise component. The SNR is calculated from thus extracted signal and noise components, and the bias voltage is applied to the APD so as to maximize the calculated SNR, Japanese patent application published as 2000-244418 has disclosed a method for controlling the bias voltage to the APD based on an optical input level and ambient temperatures. In this disclosure, a PIN-PD provided in addition to the APD receives the input light, and the bias voltage applied to the APD is controlled by the reference signal generated by the PIN-PD. This patent application has also disclosed that the bias voltage applied to the APD is adjusted based on the ambient temperature.

These prior applications have disclosed that the bias voltage applied to the APD, namely the multiplication factor thereof, may be adjusted as the change of the optical input level of the temperature. However, as shown in FIG. 7, the photo current output from the APD changes even under the constant bias voltage. Especially, in a region of the bias voltage from 30V to 60V where a significant multiplication factor is obtained, the output photo current, i.e. the multiplication factor, widely changes as the temperature varies.

The PIN-PD has a quite smaller temperature dependence of the multiplication factor compared to that of the APD, and the magnitude thereof is nearly unity. Accordingly, by using the PIN-PD as a monitor device for the input light and controlling the bias voltage applied to the APD based on the output from the PIN-PD, the multiplication factor of the APD, especially a drift for the temperature, may be suppressed. However, to prepare the PIN-PD independently on the APD becomes an apparatus to be complex, and to adjust the light-receiving condition between the APD and thus prepared PIN-PD may be a troublesome procedure. Thus, the independent PIN-PD on the APD may not appropriately control the bias voltage to the APD.

SUMMARY OF THE INVENTION

One object of the present invention is to provide an optical apparatus, in which a monitor signal with small temperature dependence may be obtained by providing no additional devices except the APD, and to provide a method for controlling the bias voltage to the APD based on thus provided monitor signal.

According to one aspect of the present invention, an optical apparatus for receiving signal light is provided. The optical apparatus includes an avalanche photodiode (APD) and a bias control circuit. The APD has a light-receiving surface that includes a first region and a second region. The APD outputs a photo current that includes a signal component generated in the first region and a monitor component generated in the second region.

The bias control circuit outputs a bias voltage to the APD and includes a high-pass-filter (HPF), a variable gain amplifier and a comparator. The HPF extracts the signal component from the photo current. The variable gain amplifier extracts the monitor component by comparing the photo current with the signal component output from the HPF, and amplifying thus extracted monitor component by a preset gain. The bias control circuit controls the bias voltage applied to the APD such that the signal component is substantially equal to the amplified monitor component.

The bias control circuit of the present invention may further include a peak hold circuit that holds a peak value of the extracted signal component output from the HPF. The comparator may compare the peak value provided from the peak hold circuit with the amplified monitor component output from the variable gain amplifier.

The bias control circuit may further-include a low-pass-filter (LPF) that smoothes the photo current. The variable gain amplifier may extract the monitor component by comparing the smoothed photo current with the extracted signal component output from the HPF.

The bias control circuit may further include an extracting amplifier that extracts the monitor component by comparing the photo current with the signal component extracted by the HPF. The preset gain of the variable gain amplifier is to be controlled based on the monitor signal extracted by the extracting amplifier.

Another aspect of the present invention is to provide an avalanche photo diode (APD) that outputs a photo current corresponding to received signal light by applying a bias voltage. The APD of the present invention includes a first electrode, a semiconductor substrate, a light-sensitive layer, a highly doped layer, and a second electrode. The substrate has a first conduction type and is provided on the first electrode. The light-sensitive layer has a first conduction type and is provided on the substrate. The highly doped layer has a second conduction type and is provided in a portion of the light-sensitive layer. The second electrode is in contact with the highly doped layer. Further, the APD of the present invention has a first and second regions. The bias voltage is applied mainly to the first region such that the first region, which includes the highly doped layer and has a significant multiplication factor, generates a first photo current corresponding to a portion of the signal light being incident in the first region, and the second region, which has a multiplication factor of substantially unity, generates a second photo current corresponding to a portion of the signal light being incident in the second region.

Still further aspect of the present invention is to provide a method for controlling a multiplication factor of the APD. The APD has a light-receiving surface that includes first and second region and outputs a photo current that includes a signal component and a monitor component generated in the first and second regions, respectively. The method may comprise: (a) extracting the signal component from the photo current; (b) extracting the monitor component from the photo current by comparing the photo current with the extracted signal component; (c) amplifying the extracted monitor component by a preset gain; and (d) comparing the amplified monitor component with the extracted signal component The multiplication factor of the APD may be controlled such that the bias voltage applied to the APD is adjusted such that the extracted signal component is substantially equal to the amplified monitor component.

The method may further include a step of, before the step (c), determining the preset gain based on the monitor component extracted from the photo current by comparing the photo current with the extracted signal component.

DETAILED DESCRIPTION OF PREFERRED EMBODIMENTS (First Embodiment)

Figure 1A:
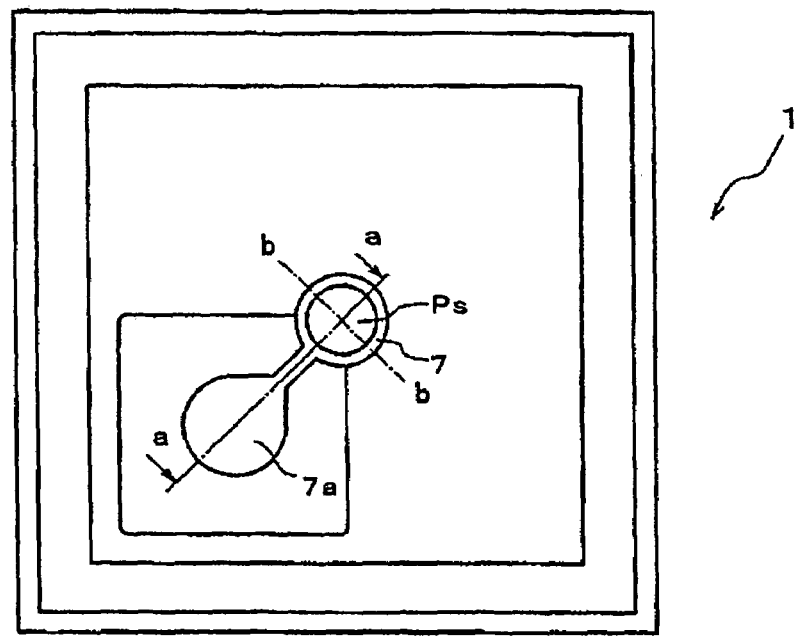
FIG. 1A is a plan view showing an avalanche photodiode (APD) of the present invention.
Figure 1B:
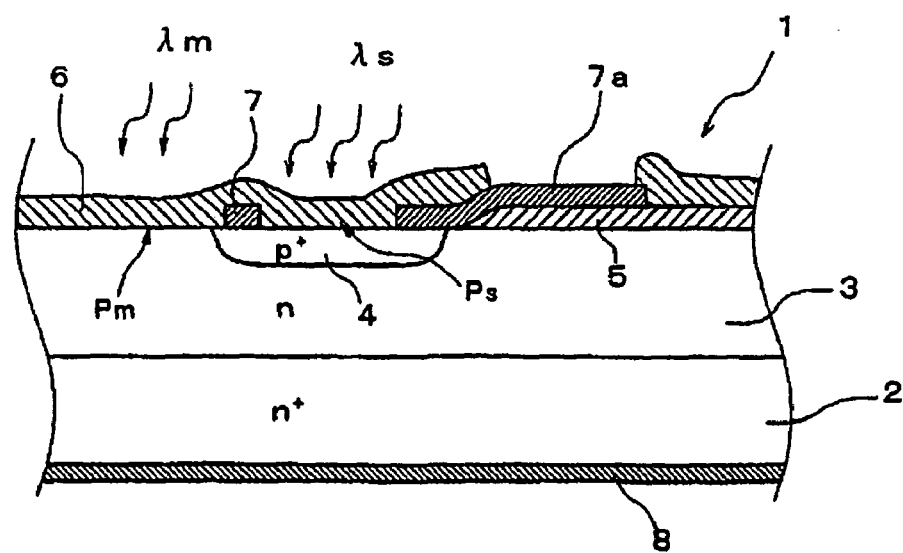
FIG. 1B is a sectional view showing the APD of the present invention.

Next, preferred embodiments of the present invention will be described as referring to accompanying drawings. FIG. 1A and FIG. 1B are a plan and a sectional view, respectively, they are showing an avalanche photodiode (APD) used in the present invention. The APD 1 includes a heavily doped substrate 2, an n-type active layer 3, a heavily doped p-type diffusion layer 4, an insulating film 6, a p-electrode 7 with a pad 7A, and an n-electrode 8. Further, the APD includes a first sensitivity region $P_S$ and a second sensitivity region $P_M$ on a primary surface thereof.

As shown in FIG. 1A, the first region $P_S$, which has a multiplication function, is formed in a restricted center region of the surface. The p-electrode 7 formed to surround the first region $P_S$, extracts the pad 7A to which a bias voltage for the PD to be supplied between the n-electrode 8 provided in a whole surface of the back surface of the APD 1. The APD 1 is formed such that (1) the active layer 3 is grown on the n$^+$-type substrate 2, (2) the diffusion mask 5, which is made of $SiO_2$ and has a diffusion opening, is formed on the active layer 2, and (3) acceptor dopants are diffused into the active layer 3 via the diffusion opening, which forms the p$^+$-type diffusion layer 4.

The ring-shaped p-electrode 7 formed around the p$^+$-diffusion layer 4 is extracted onto the insulating layer 5. Within the p-electrode 7 is provided with a second insulating film 6 made of $Si_3N_4$, which has a thickness to operates as an anti-reflection coating for a signal wavelength $\lambda_S$. As shown in the sectional view of FIG. 1B, when the bias voltage is provided between the p-electrode 7 and the n-electrode 8, this bias voltage is affected only to a portion just under the first region $P_S$, not applied to portions out of the first region $P_S$.

The insulating film 6 out of the p-electrode 7 is formed so as to be transparent for the wavelength $\lambda_m$ of the signal light, and the n-electrode 8 is formed in the whole back surface of the APD 1. Accordingly, incident light into the portion outside the p-electrode generates photo-currents, but the multiplication factor therein becomes smaller than unity, because the bias voltage is not affected to this region, thus no electric field is induced. In the present invention, the portion within the p-electrode and showing a significant multiplication factor will be called as the first region $P_S$, while the portion outside the p-electrode and showing no electric field and no multiplication factor is called as the second region $P_M$.

Figure 2:
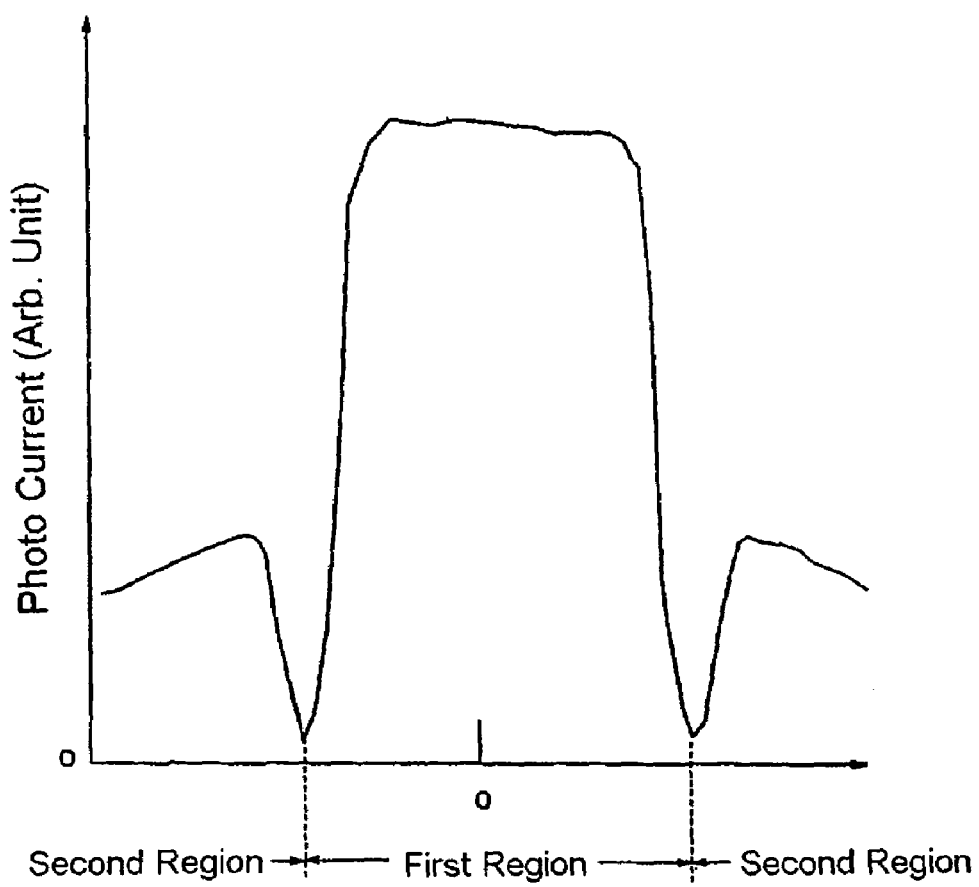
FIG. 2 shows a relation between the photo current generated by the APD shown in FIG. 1 and the region where the light is incident therein.

FIG. 2 shows a sensitivity of the APD along a line B—B intersecting both regions of $P_S$ and $P_M$, which is shown in FIG. 1A. The vertical axis denotes a magnitude of the photo current. Center portion of FIG. 2 corresponds to the first region $P_S$, while both sides of the center portion correspond to the second region $P_M$. When the light enters the first region $P_S$, a large photo current will be obtained. On the other hand, when the light enters the second region outside of the p-electrode 7, the magnitude of the photo current becomes only ⅓ compared to that of the first region $P_S$. Further, since the second region $P_M$ is not affected from the bias voltage, the temperature dependence of the multiplication factor therein also becomes small compared to that in the first region.

Figure 3:
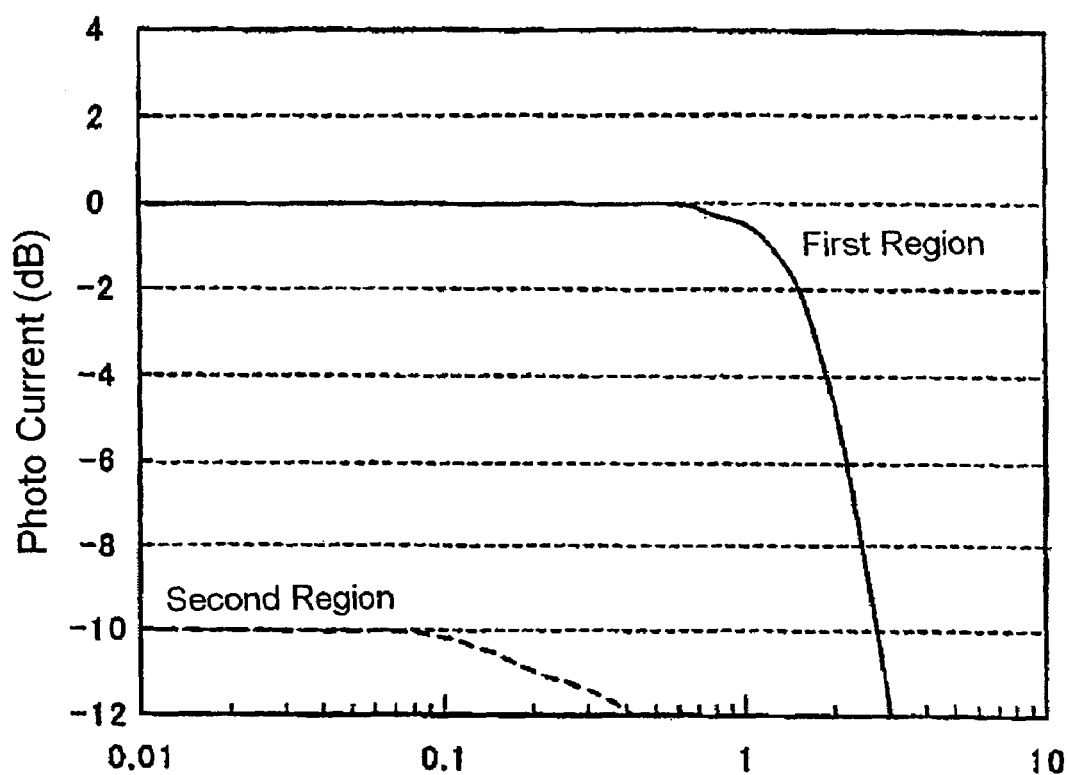
FIG. 3 shows a relation between the frequency response of the photo current detected in the first and second regions of the APD shown in FIG. 1.

FIG. 3 show frequency responses of the multiplication factor attributed to the first and second regions. The first region is capable of responding to high frequency signals over 1 GHz. On the other hand, that of the second region remarkably decreases in high frequencies in addition to the magnitude thereof being unity at most. The response of the second region $P_M$ is limited to regions below 0.5 GHz.

Therefore, two signals each generated in the first and second regions $P_S$ and $P_M$, may be divided by passing a high-pass-filter, a cut-off frequency of which is about 500 MHz. That is, a signal passing through the high-pass-filter only involves the signal attributed to the first region, while another signal not passing through the filter involves both signals. Therefore, by processing these two signals, one is original and the other is pass-through the filter, two signals originally attributed to first and second regions, $P_S$ and $P_M$, respectively, can be distinguished. Further, the bias voltage can be controlled so as to maintain the multiplication factor or to maintain the output of the APD independent of the optical input.

Figure 4:
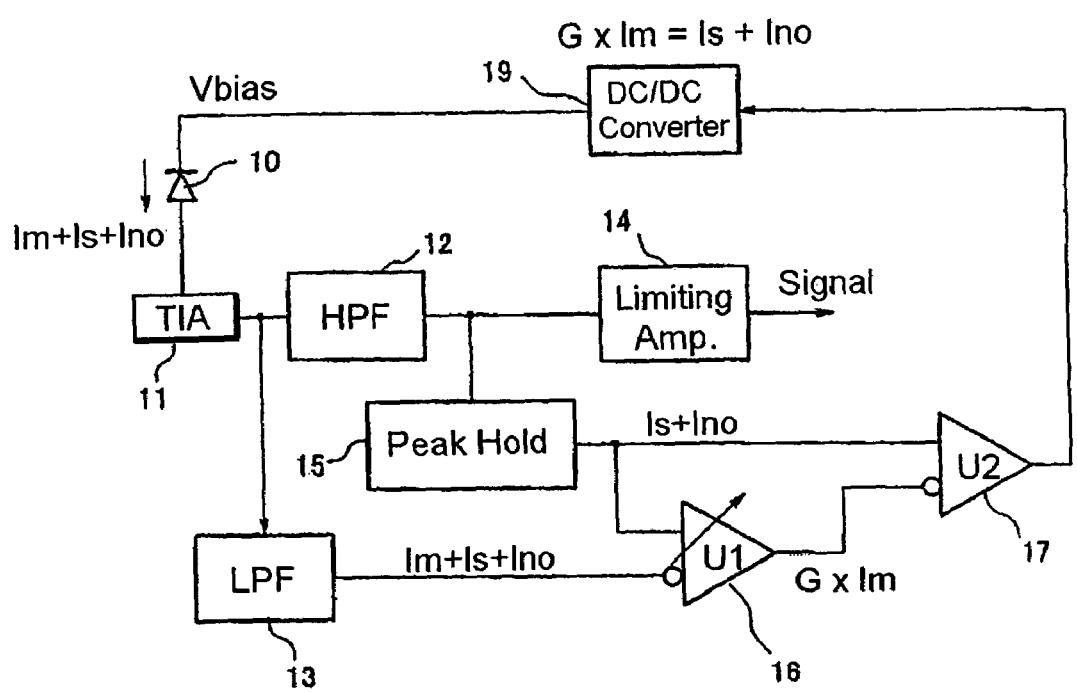
FIG. 4 is a block diagram of the control circuit according to the first embodiment of the present invention.
Figure 5:
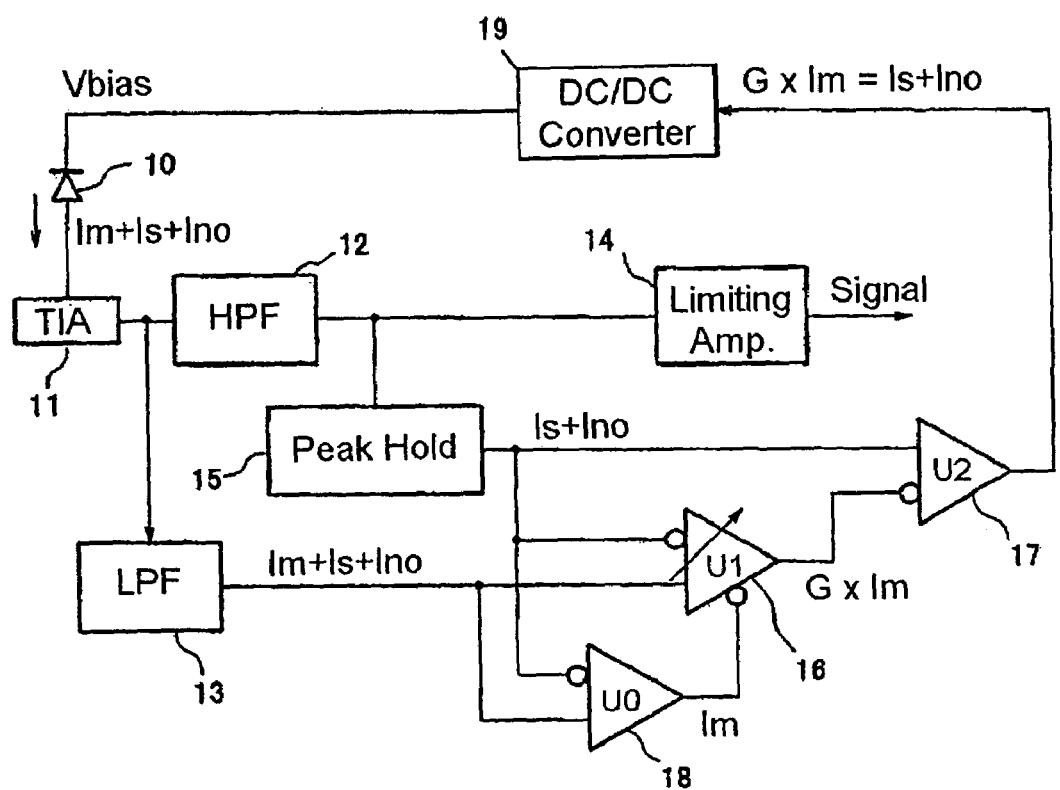
FIG. 5 is a block diagram of the control circuit according to the second embodiment of the present invention.

FIG. 4 and FIG. 5 show examples of the control circuit to maintain the multiplication factor of the APD. The control circuit includes an APD 10, a pre-amplifier 11, which is often called as a trans-impedance amplifier (TIA), a high-pass filter (HPF) 12, a low-pass filter (LPF) 13, a limiting amplifier 14, a peak-hold circuit 15, an operational amplifiers 16, 17 and 18, and a DC/DC converter 19.

The APD 10, as shown previously in FIG. 1, includes first and second regions. The former shows a significant multiplication factor depending on the bias voltage applied thereto, while the latter is not affected by the bias voltage and shows no significant multiplication characteristics. The signal output from the APD 10 includes components of the first signal $I_S$, the second signal $I_M$, and the third signal $I_{NO}$. They correspond to the optical signal detected in the first region $P_S$, the other optical signal detected in the second region $P_M$, and the noise that is common in the first region $P_S$ and the second region $P_M$, respectively. The signal output from the APD 10 is input into the trans-impedance amplifier (TIA) 11. The noise component $I_{NO}$ includes a noise intrinsically involved in the optical signal itself, that generated at the conversion from the optical to the electrical data at the APD 10, that involved in the bias supply, and those derived from the whole other reasons.

The TIA 11 converts the current signal including $I_S$, $I_M$ and $I_{NO}$ into a corresponding voltage signal. The high-pass-filter (HPF) 12 extracts the signal $I_S$ and the noise $I_{NO}$, cutting the monitor signal $I_M$. On the other hand, the low-pass-filter (LPF) 13 still includes all signal components of $I_S$, $I_M$, and $I_{NO}$.

The first signal ($I_S+I_{NO}$), passing the HPF 12, is amplified by and output from the limiting amplifier 14. Further, the magnitude of the first signal may be obtained by passing the peak hold 15, such as a rectification circuit including a diode and a capacitor as a load of the diode. On the other hand, the second signal ($I_S+I_M+I_{NO}$) passing the LPF 13 may be automatically obtained in its magnitude by setting the cut-off frequency of the LPF 13 to be quite small frequency. These first and second signals are compared and amplified in their difference by the variable gain amplifier (U1) 16.

Thus, the variable gain amplifier 16 may output the component of only the monitor signal $I_M$ multiplied by the gain G thereof. The amplified monitor signal $I_M \times G$ and the first signal ($I_S+I_{NO}$) are differentiated by another amplifier (U2) 17. Finally, the DC/DC-converter 19 outputs the bias voltage to the APD 10 such that these amplified monitor signal $I_M \times G$ is equal to the first signal $I_S+I_{NO}$.

This closed loop operation is carried out such that the first signal, which corresponds to the light detected in the first region $P_S$ where the significant multiplication factor is affected, is equalized to the monitor signal compensated by the gain G, which corresponds to the light detected in the second region $P_M$ where the bias voltage is not affected and does not show the significant multiplication factor. Since the monitor signal does not contain the components, the magnitude of which is not affected to temperatures, the multiplication factor of the APD 10 can be kept substantially constant even when the temperature thereof changes.

(Second Embodiment)

The bias voltage for the APD is 10 conventionally configured such that, when the optical input becomes large, the multiplication factor may automatically decrease and reduce the bias current. However, the circuit shown in FIG. 4 controls the bias voltage to the APD 10 such that the first signal containing the $I_S$ and $I_{NO}$ is equal to the monitor signal $I_M$ multiplied by the gain G. The magnitude of the light detected at the first region $P_S$ is proportional to that detected at the second region $P_M$, as far as the beam spot, the shape and the location on the APD 10, does not change. Therefore, the increase of the signal $I_S$ corresponding to the light detected by the first region means that the signal $I_M$ corresponding to the light detected by the second region becomes large. Therefore, the APD 10 may be broken by the photo current generated by it self at the condition that a large optical enters. Further, when the photo current generated by the APD 10 becomes large, the circuit connected to the APD may saturate.

One solution to solve such situation that the large optical signal enters the APD 10 is shown in FIG. 5. The bias voltage to the APD 10 in the circuit of FIG. 5 may be changed as the optical signal increases. The APD 10 has the same configuration with that of shown in FIG. 4, namely, which generates the current signal $I_S$ corresponding to the light received in the first region $P_S$, another current signal $I_M$ corresponding to the light received in the second region $P_M$, and the noise component $I_{NO}$ commonly involved in both $I_S$ and $I_M$. The signal including these components is input to the TIA 11.

The output of the TIA 11 is divided into two signals, one of which contains $I_S+I_{NO}$ after passing the HPF 12 and the peak hold 15, the other of which, containing $I_S$, $I_M$, and $I_{NO}$, is input both the amplifier (U0) 18 and the amplifier (U1) 16 after passing the LPF 13. The output of the amplifier U1, same with that shown in FIG. 4, generates the second signal, the monitor signal multiplied by the gain of the amplifier U1 ($G \times I_M$). The difference between the first signal ($I_S+I_{NO}$) and the second signal ($G \times I_M$) may be detected by the amplifier U2, and the bias voltage $V_{BIAS}$ to the APD 10 is controlled by the DC/DC-converter 19 such that the difference of the first and second signals becomes zero.

However, the circuit shown in FIG. 5, when the monitor signal $I_M$, which is generates by the amplifier U0 by comparing the first signal ($I_S+I_{NO}$) and the second signal ($I_S+I_M+I_{NO}$), becomes large, the gain G of the amplifier U1 may decrease. Contrary to the above situation, when the monitor signal $I_M$ becomes small, the gain G of the amplifier U1 becomes large, thereby keeping the output, which is the monitor signal multiplied by the gain thereof ($G \times I_M$), of the variable gain amplifier U1 constant. Thus, by the configuration shown in FIG. 5, even when the temperature of the APD 10 changes and the magnitude of the optical input changes, the output of the APD 10 can be maintained to the predetermined value.

Figure 6A:
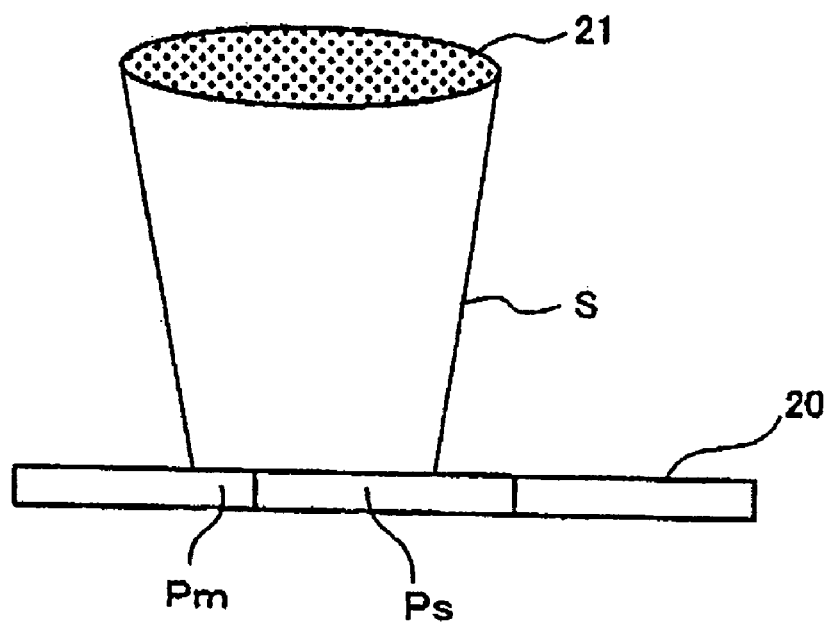
FIG. 6A shows a first configuration of the APD by which the present invention is carried out.
Figure 6B:
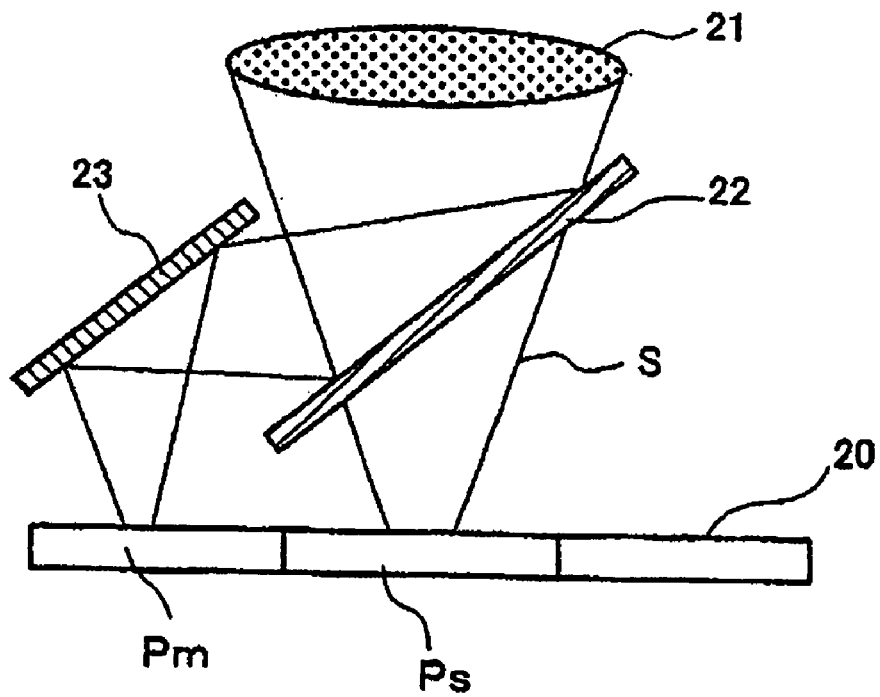
FIG. 6B shows a second configuration of the present invention.
Figure 7:
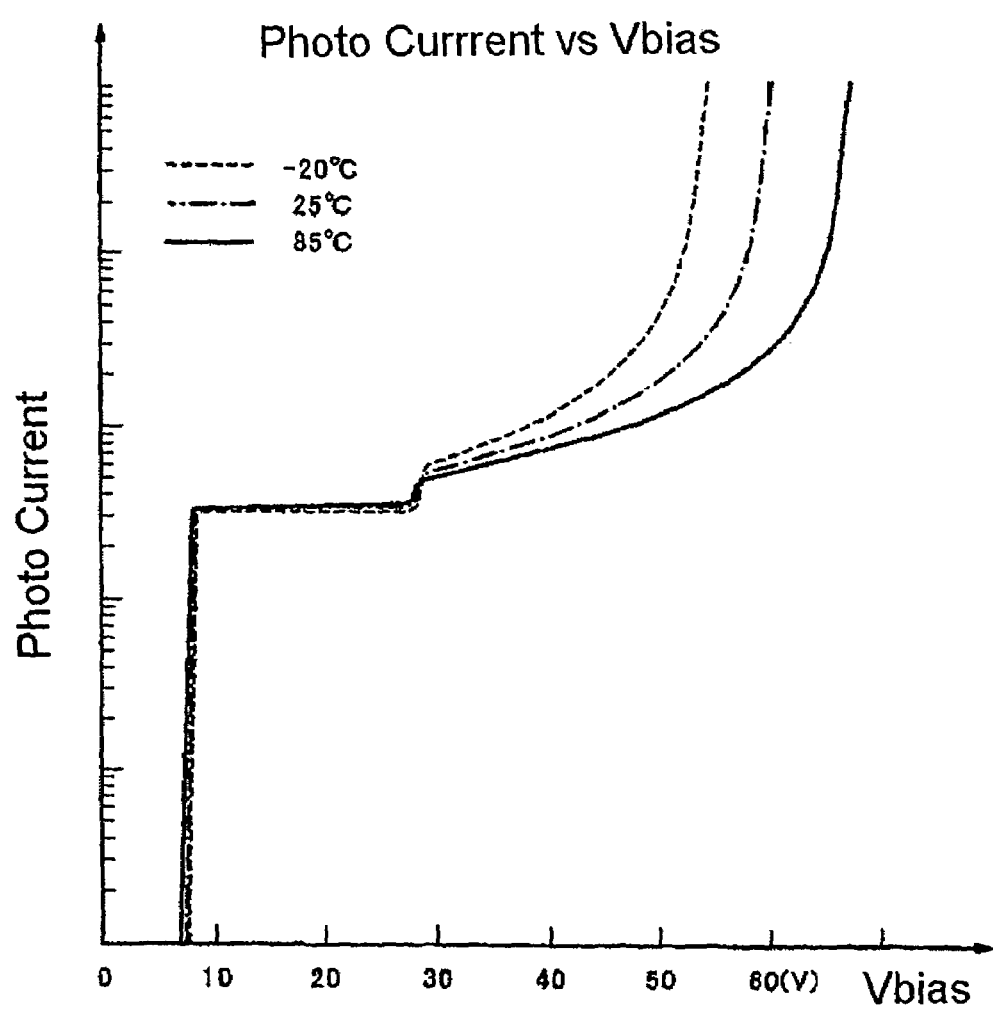
FIG. 7 shows a typical relationship between the photo current and the applied bias voltage of the APD at various temperatures.

FIG. 6A shows a configuration for the APD to carry out the present invention, and FIG. 6B shows another configuration. The primary surface, the light-sensitive surface, of the APD 20 includes the first region $P_S$, where the significant multiplication factor is appeared by the application of the bias voltage, and the second region $P_M$, where no multiplication factor is appeared. Conventionally, the light S is focused by the condenser lens 21 so as to be incident only in the first region $P_S$.

In the present invention, as shown in FIG. 6A, the lens 21 may expand the beam spot of the light S such that not only the first region $P_S$ but also the second region $P_M$ may receive the portion of the light S. The greater part of the light S is detected by the first region $P_S$, a portion of the light S may be detected in the second region $P_M$. The photo current $I_M$ derived from the second region $P_M$ can be so utilized in the present invention that shown in FIG. 4 and FIG. 5.

FIG. 6B shows another configuration, by which the present invention may carry out. A half mirror 22 divides the light S condensed by the lens 21 into two beams. One of beams is incident in the first region $P_S$ and generates the current $I_S$, while the other beam is incident in the second region $P_M$ and generates the monitor signal $I_M$.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the present invention.

What is claimed is:

1. An optical apparatus for receiving signal light, comprising:
    an avalanche photodiode having a light-receiving surface including a first region and a second region, said avalanche photodiode outputting a photo current including a signal component generated in said first region and a monitor component generated in said second region;
    a bias control circuit for outputting a bias voltage to be provided to said avalanche photodiode, said bias control circuit comprising,
    a high-pass-filter for extracting said signal component from said photo current output from said avalanche photodiode,
    a variable gain amplifier having a preset gain, said variable gain amplifier extracting said monitor component from said photo current by comparing said photo current with said signal component output from said high-pass-filter, and amplifying said extracted monitor component by said preset gain; and
    a comparator for comparing said signal component and said amplified monitor component,
    wherein said bias voltage applied to said avalanche photodiode is controlled such that said signal component is substantially equal to said amplified monitor component.

2. The optical apparatus according to claim 1, wherein said bias control circuit further comprises a peak hold circuit for holding a peak value of said extracted signal component, said comparator comparing said peak value with said amplified monitor component, and
    wherein said bias voltage applied to said avalanche photodiode is controlled such that said peak value output from said peak hold circuit is equal to said amplified monitor component.

3. The optical apparatus according to claim 1, wherein said bias control circuit further comprises a low-pass filter for smoothing said monitor signal and for outputting a smoothed monitor signal, said variable gain amplifier extracting said gained monitor signal from said signal component and said smoothed monitor signal.

4. The optical apparatus according to claim 1, wherein said bias control circuit hither comprises an extracting amplifier for extracting said monitor component by comparing said photo current with said signal component extracted by said high-pass-filter, said preset gain of said variable gain amplifier being controlled based on said monitor component extracted by said extracting amplifier.

* * * * *